(12) United States Patent
Take et al.

(10) Patent No.: US 8,482,907 B2
(45) Date of Patent: Jul. 9, 2013

(54) ELECTRONIC DEVICE AND WALL HANGING STRUCTURE OF ELECTRONIC DEVICE

(75) Inventors: Nobuyuki Take, Higashioska (JP); Tsuyoshi Okumura, Higashioska (JP); Naotaka Namioka, Daito (JP)

(73) Assignee: SANYO Electric Co., Ltd., Moriguchi-shi, Osaka (JP)

( * ) Notice: Subject to any disclaimer, the term of this patent is extended or adjusted under 35 U.S.C. 154(b) by 184 days.

(21) Appl. No.: 13/034,873

(22) Filed: Feb. 25, 2011

(65) Prior Publication Data
US 2011/0211301 A1  Sep. 1, 2011

(30) Foreign Application Priority Data
Feb. 26, 2010 (JP) ................................. 2010-041842

(51) Int. Cl.
*H05K 7/00* (2006.01)
*H05K 5/00* (2006.01)
*G06F 1/16* (2006.01)

(52) U.S. Cl.
USPC ............ 361/679.01; 361/679.21; 361/679.22; 361/679.26; 248/917; 248/918

(58) Field of Classification Search
USPC .................. 361/679.01, 679.03, 681, 679.21, 361/679.22, 679.26, 679.3, 679.41, 679.55, 361/679.56; 248/917–924; 455/575.1, 575.8
See application file for complete search history.

(56) References Cited

U.S. PATENT DOCUMENTS

| | | | |
|---|---|---|---|
| 5,947,438 A * | 9/1999 | Lemire | 248/476 |
| 6,286,794 B1 * | 9/2001 | Harbin | 248/123.2 |
| 6,402,109 B1 * | 6/2002 | Dittmer | 248/284.1 |
| 7,334,765 B2 * | 2/2008 | Hwang | 248/284.1 |
| 7,611,103 B2 * | 11/2009 | Ha et al. | 248/125.2 |
| 2007/0097617 A1 * | 5/2007 | Searby et al. | 361/686 |
| 2007/0211417 A1 * | 9/2007 | Turusaki et al. | 361/681 |
| 2009/0231808 A1 * | 9/2009 | Burgner | 361/695 |
| 2010/0133409 A1 * | 6/2010 | Park et al. | 248/470 |

FOREIGN PATENT DOCUMENTS
JP   2007-233018 A   9/2007

* cited by examiner

Primary Examiner — Anthony M Haughton
Assistant Examiner — Zhengfu Feng
(74) Attorney, Agent, or Firm — Westernman, Hattori, Daniels & Adrian, LLP

(57) ABSTRACT

A wall hanging structure of an electronic device according to the present invention includes: a wall hanging bracket disposed on a rear surface of a chassis; a main body fastening screw screwed from the rear surface of the chassis into a rear surface of a main body unit; a bracket fastening screw screwed from a rear surface of the wall hanging bracket into the rear surface of the chassis; and a coupling member which extends inside the chassis between the main body fastening screw and the bracket fastening screw and which couples both fastening screws to each other.

5 Claims, 7 Drawing Sheets

ELECTRONIC DEVICE AND WALL HANGING STRUCTURE OF ELECTRONIC DEVICE

This application claims priority based on Japanese Patent Application No. 2010-41842, the contents of which are hereby incorporated by reference into the present application.

BACKGROUND OF THE INVENTION

1. Field of the Invention

The present invention relates to a wall hanging structure for mounting an electronic device such as a flat panel television receiver to a wall surface.

2. Description of the Related Art

Conventionally, a flat panel television receiver is mounted to a wall surface by a wall hanging bracket. With such a wall hanging structure, a wall hanging bracket is disposed on a rear surface of a chassis of the flat panel television receiver, and a plurality of screws are screwed from a rear surface of the wall hanging bracket into the rear surface of the chassis to fix the wall hanging bracket to the chassis. Subsequently, the wall hanging bracket is coupled to a wall surface-side receiving bracket to mount the flat panel television receiver to the wall surface.

Moreover, since a chassis is generally made of plastic, an insert nut into which a tip of the screw is to be screwed is embedded in the chassis and is used to couple the chassis and the wall hanging bracket to each other with sufficient strength.

However, in the conventional wall hanging structure, a special coupling structure is not provided between a main body unit such as a image display panel housed inside a chassis and the wall hanging bracket despite the main body unit being sufficiently heavy. Instead, simply, screws are screwed from a rear surface of the chassis to a rear surface of the main body unit and screws are screwed from a rear surface of the wall hanging bracket to the chassis.

In this case, the weight of the main body unit is to be supported to a chassis portion (plastic portion) into which screws for fastening the wall hanging bracket are screwed. Therefore, if the chassis softens due to heat or the strength of the chassis deteriorates due to aging degradation, there is a risk of breakage of the chassis portion into which screws for fastening the wall hanging bracket are screwed, and as a result, the main body unit, together with the chassis, may become detached from the wall surface.

SUMMARY OF THE INVENTION

A wall hanging structure of an electronic device according to the present invention includes:
- a wall hanging bracket 2 disposed on a rear surface of a chassis 1;
- a main body fastening screw 41 screwed from the rear surface of the chassis 1 into a rear surface of a main body unit;
- a bracket fastening screw 4 screwed from a rear surface of the wall hanging bracket 2 into the rear surface of the chassis 1; and
- a coupling member 5 which extends inside the chassis 1 between the main body fastening screw 41 and the bracket fastening screw 4 and which couples both fastening screws 41 and 4 to each other.

DETAILED DESCRIPTION OF THE PREFERRED EMBODIMENT

Figure 1:
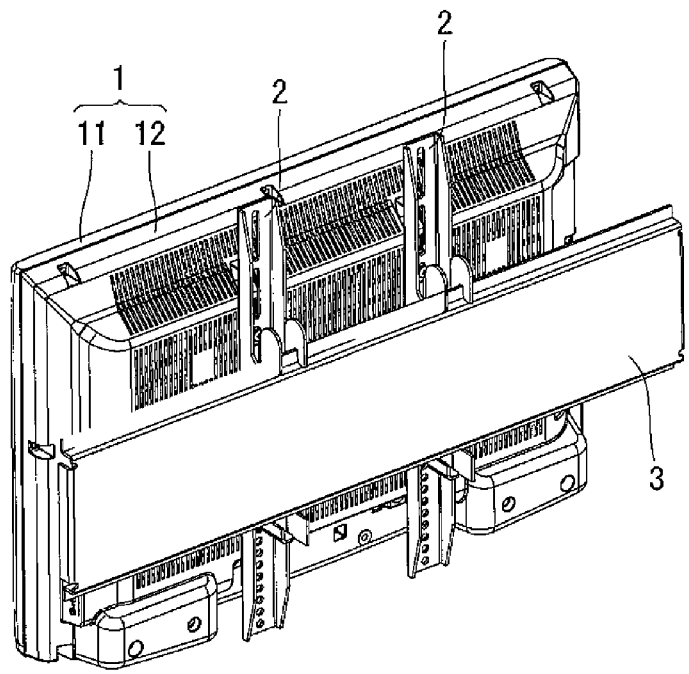
FIG. 1 is a perspective view illustrating a wall hanging structure of a flat panel television receiver that is an embodiment of the present invention as seen from a rear surface side.
Figure 2:
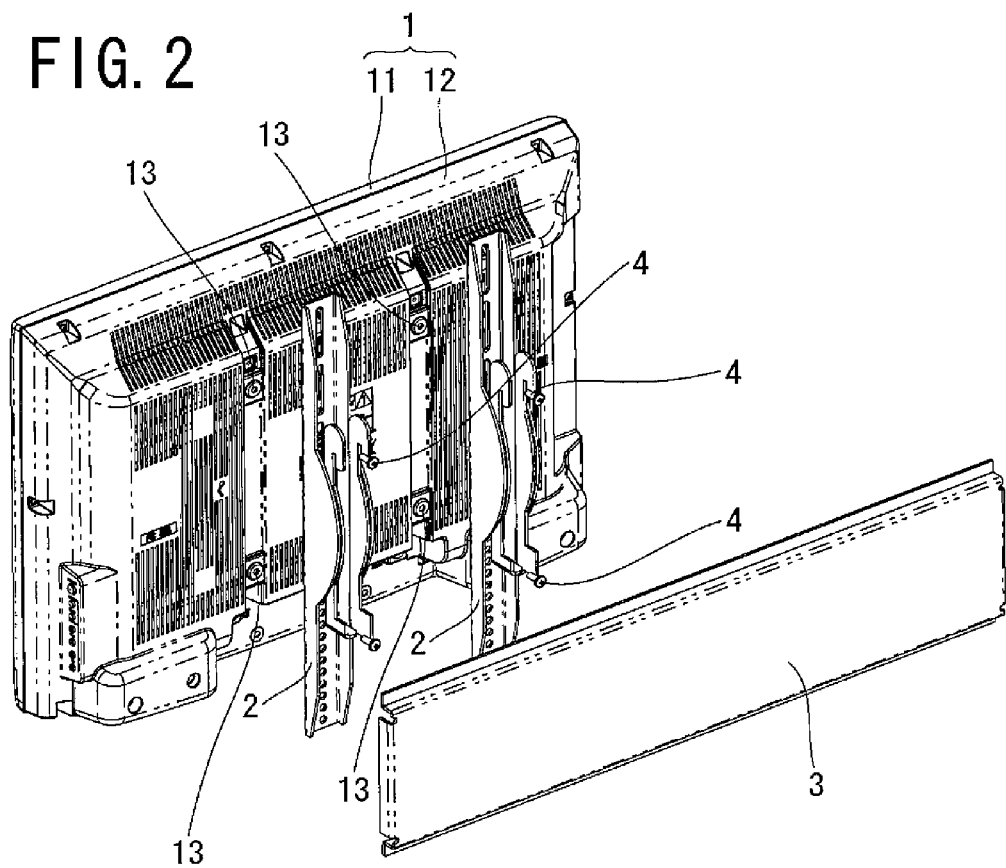
FIG. 2 is an exploded perspective view of the wall hanging structure.

Hereinafter, an embodiment of the present invention implemented on a wall hanging structure of a flat panel television receiver will be concretely described with reference to the drawings. As illustrated in FIGS. 1 and 2, in the wall hanging structure of the flat panel television receiver which is an embodiment of the present invention, a pair of left and right wall hanging brackets 2, 2 is fixed to a rear surface of the chassis 1, a receiving bracket 3 is fixed to a wall surface (not shown), and the chassis 1 is mounted to the wall surface by engaging the wall hanging brackets 2, 2 to the receiving bracket 3.

The chassis 1 is configured by joining and fixing a front cabinet 11 and a back cabinet 12 to each other. As illustrated in FIGS. 5 to 8, an image display panel 10 is housed inside the chassis 1.

As illustrated in FIG. 2, the pair of left and right wall hanging brackets 2, 2 each has an oblong stay-like shape. Two (upper and lower) bracket fastening screws 4, 4 penetrate each wall hanging bracket 2 from a rear surface side of the wall hanging bracket 2. A total of four bracket fastening screws 4 to 4 are arranged at four vertex positions of a square that is smaller than a contour shape of the image display panel 10.

Figure 3:
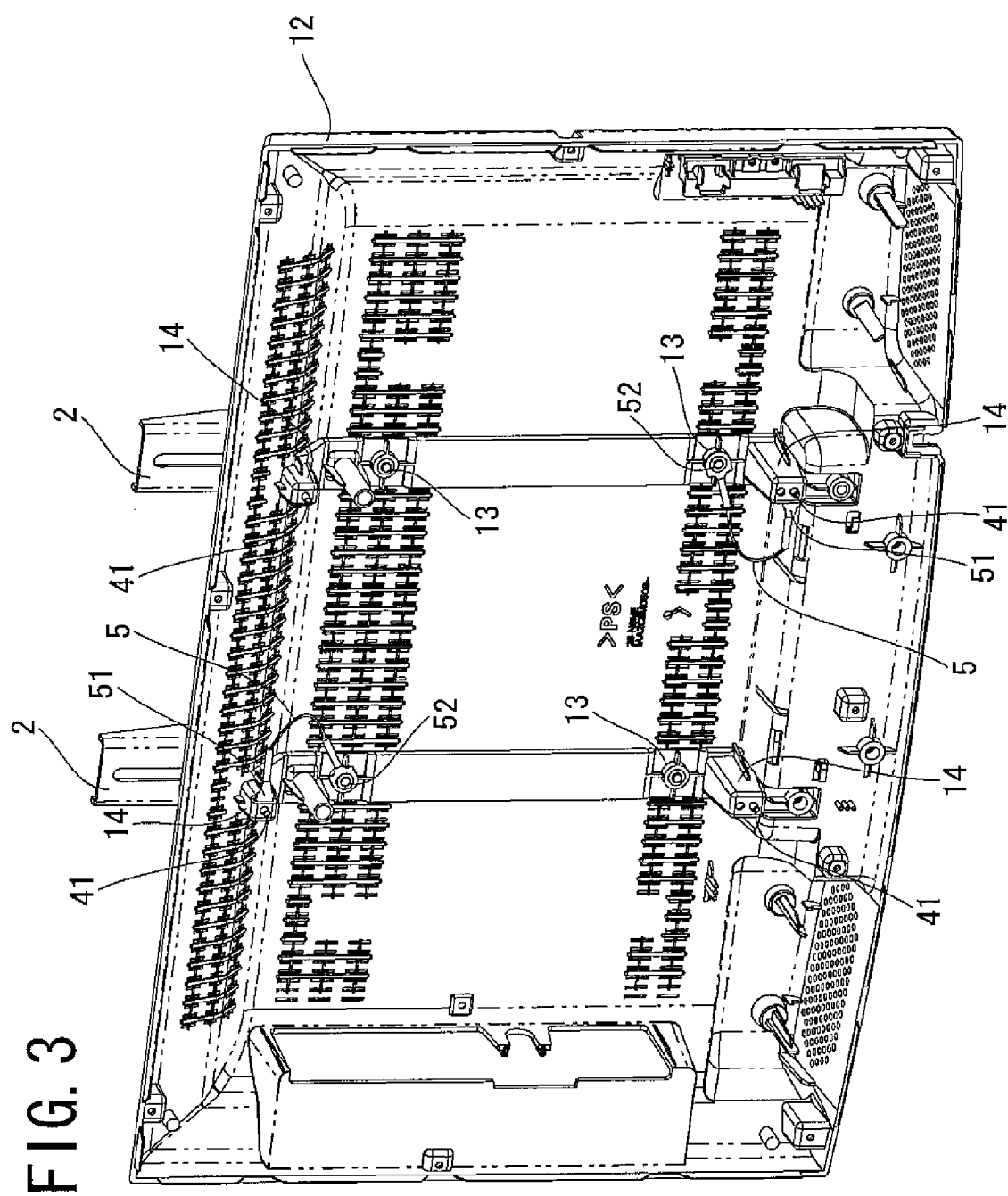
FIG. 3 is a perspective view of a back cabinet as seen from an inner surface side.

Tips of the four bracket fastening screws 4 to 4 are respectively screwed into four insert nuts 13 to 13 embedded in the back cabinet 12. As illustrated in FIG. 3, each of the four insert nuts 13 to 13 is exposed to an inner surface side of the back cabinet 12.

Figure 4:
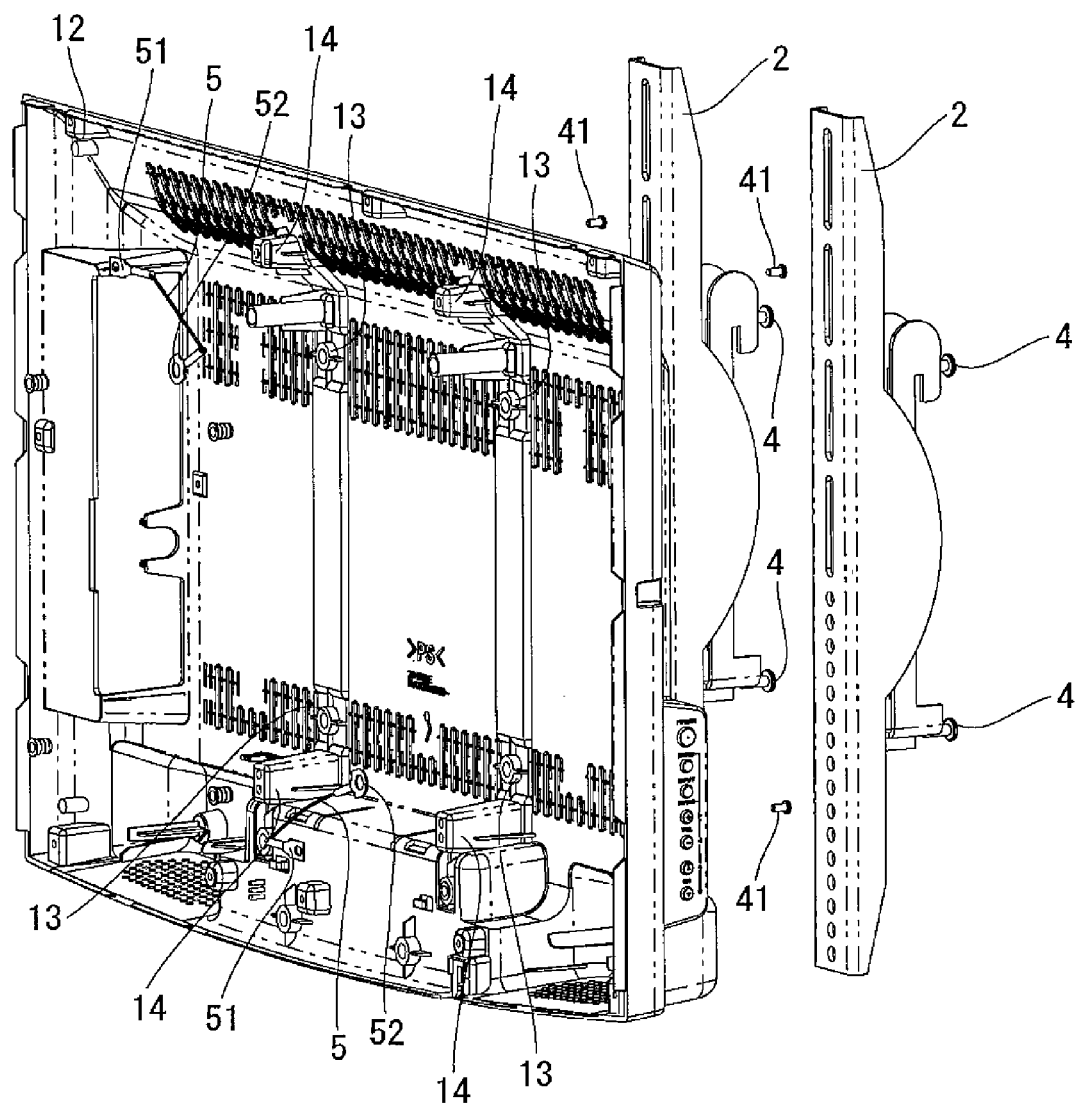
FIG. 4 is an exploded perspective view of the back cabinet as seen from an inner surface side.
Figure 5:
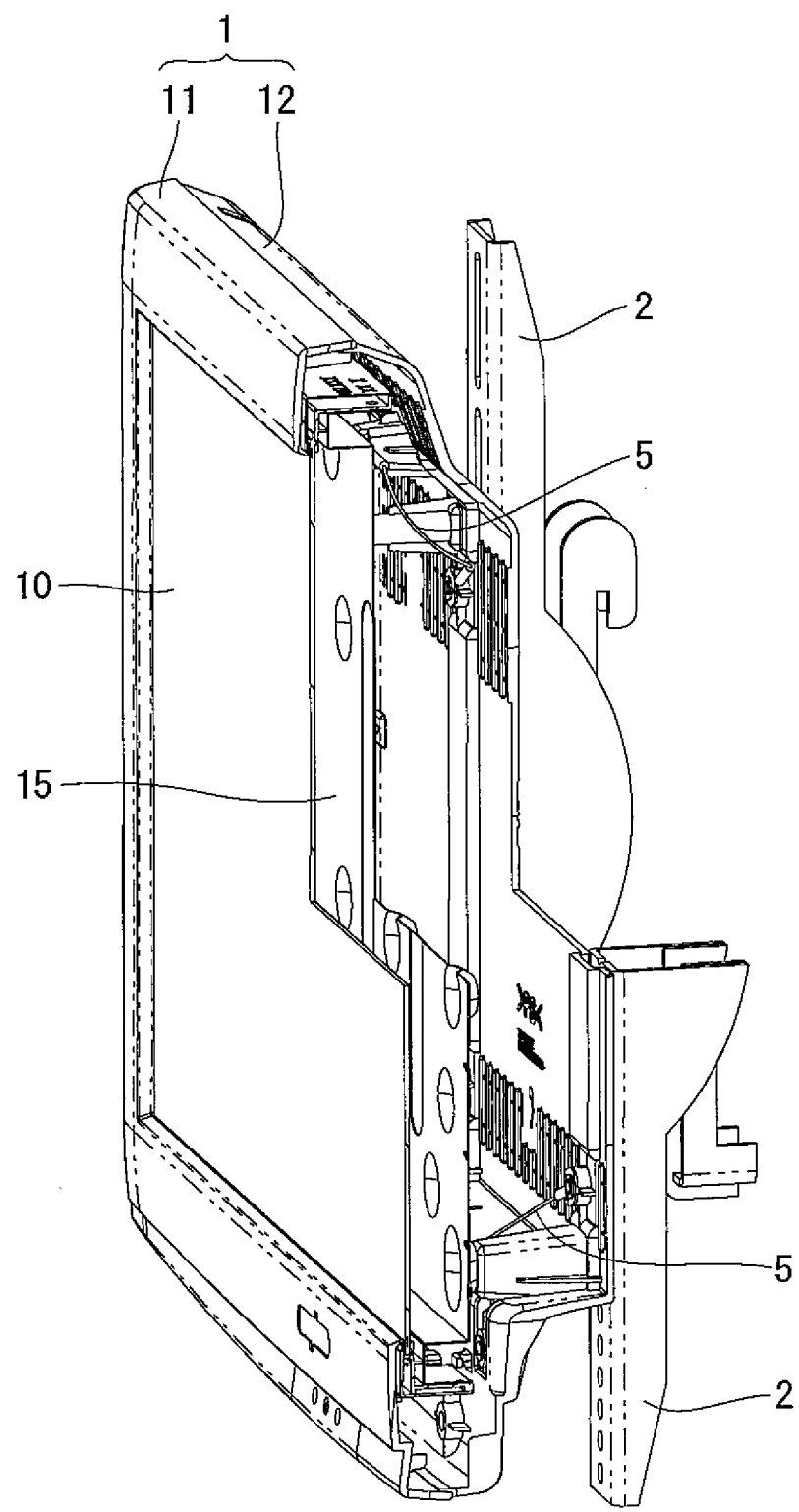
FIG. 5 is a partially cutaway perspective view of the wall hanging structure as seen from a front surface side.
Figure 6:
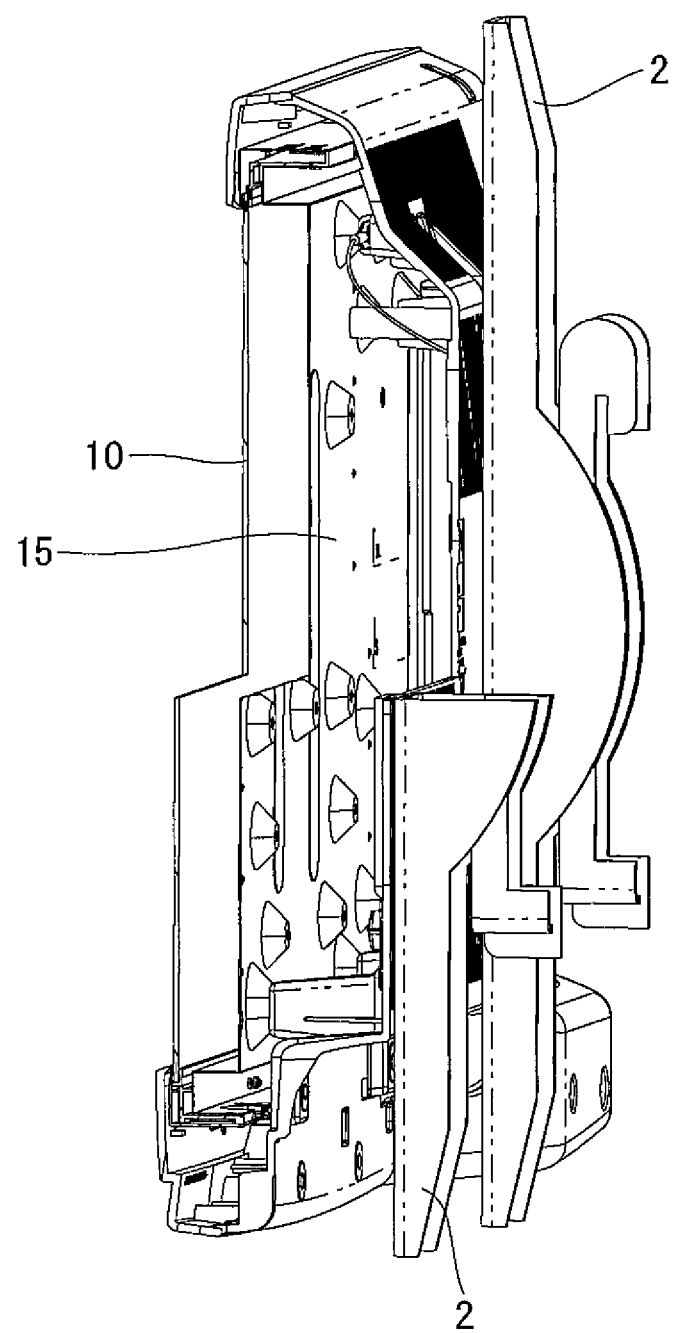
FIG. 6 is a partially cutaway perspective view of the wall hanging structure as seen from a rear surface side.
Figure 7:
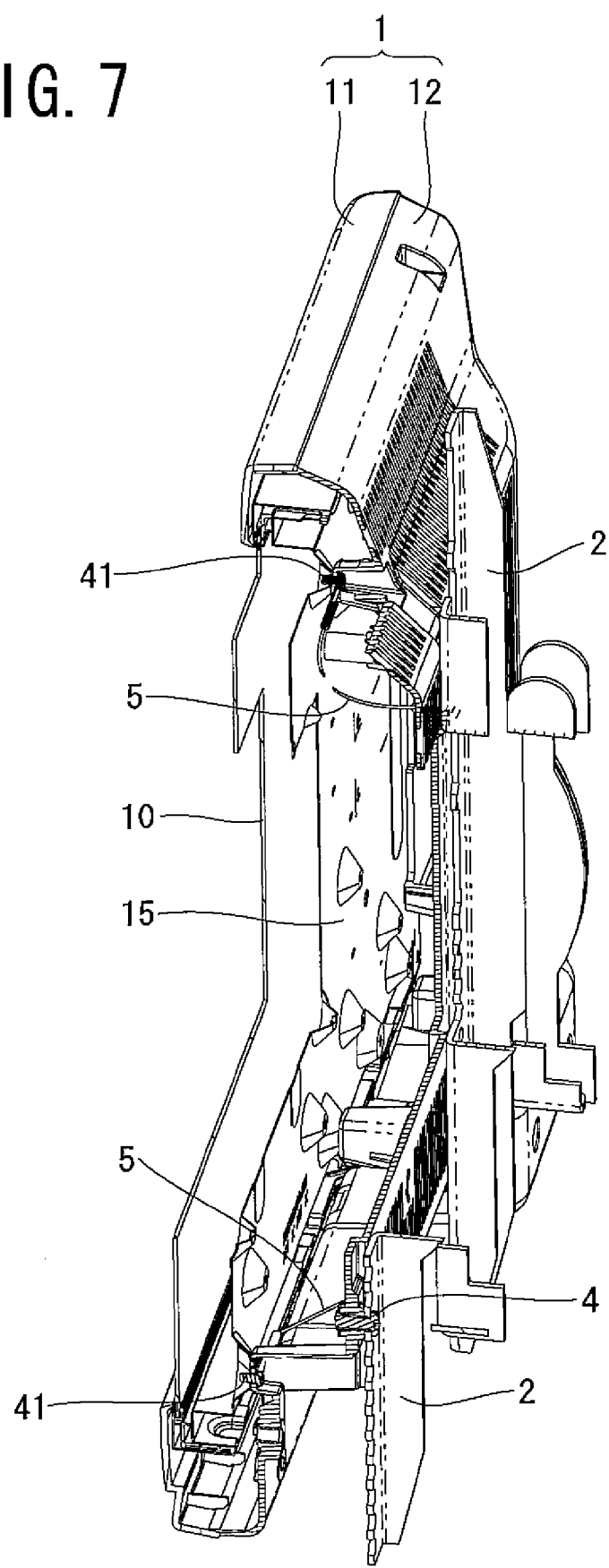
FIG. 7 is another partially cutaway perspective view of the wall hanging structure as seen from the rear surface side.
Figure 8:
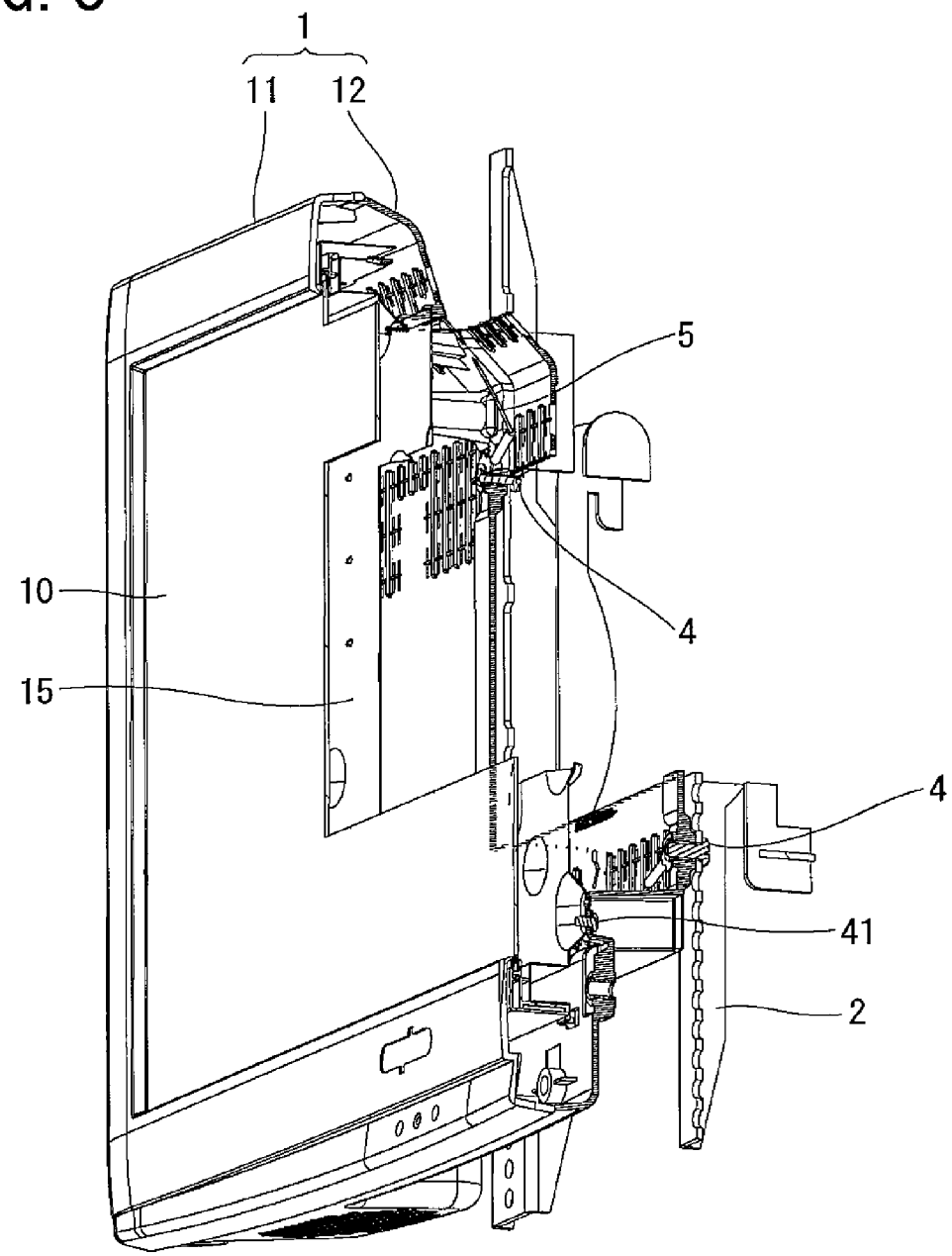
FIG. 8 is another partially cutaway perspective view of the wall hanging structure as seen from the front surface side.

As illustrated in FIG. 4, four bosses 14 to 14 are protrudingly provided so as to face inward on the back cabinet 12 at positions above the two upper insert nuts 13, 13 and at positions below the two lower insert nuts 13, 13 so as to correspond to four vertex positions of a square that is smaller than a contour shape of the image display panel 10. Four main body fastening screws 41 to 41 penetrate the four bosses 14 to 14 from the outer side of the back cabinet 12, and the tips of the four main body fastening screws 41 to 41 are respectively screwed into a metal plate 15 that is a rear surface member of the image display panel 10 illustrated in FIGS. 5 to 8.

As illustrated in FIGS. 3 and 4, with the four bosses 14 to 14 and the four insert nuts 13 to 13, a boss and an insert nut in close proximity with each other form a pair. A coupling member 5 made of a metallic wire extends between a pair formed by a boss 14 and an insert nut 13 respectively disposed at two vertex positions that form a diagonal relationship among the four vertex positions.

The coupling member 5 is provided at both ends thereof with ring-like metallic coupling parts 51 and 52. The main body fastening screw 41 penetrating the boss 14 penetrates one coupling part 51 of the coupling member 5, and a bracket fastening screw 4 screwed into the insert nut 13 penetrates the other coupling part 52 of the coupling member 5. Accordingly, a pair formed by a main body fastening screw 41 and a bracket fastening screw 4 respectively disposed at two vertex positions that form a diagonal relationship among the four vertex positions are coupled to each other by the coupling member 5.

According to the wall hanging structure of the flat panel television receiver described above, even if the chassis 1 softens due to heat or a deterioration in strength occurs due to aging degradation and causes breakage of a chassis portion into which the bracket fastening screw 4 is screwed, since the metal plate 15 of the image display panel 10 is coupled to the wall hanging bracket 2 that is engaged with the receiving bracket 3 on the wall surface via the main body fastening screw 41, the coupling member 5, and the bracket fastening screw 4 which are respectively metallic and have sufficient strength, the image display panel 10 slightly drops and is suspended in accordance with the length of the coupling member 5 but is nevertheless prevented from dropping to the floor from the wall surface.

In particular, since the main body fastening screw 41 and the bracket fastening screw 4 are coupled to each other by the coupling member 5 at two locations where two vertex positions form a diagonal relationship among the four vertex positions of a square, even if breakage occurs at chassis portions into which the four bracket fastening screws 4 to 4 are screwed, the image display panel 10 is to be suspended from the wall surface by the two coupling members 5, 5 and a posture of the image display panel 10 is to be prevented from inclining strongly.

Moreover, the two coupling members 5, 5 are desirably formed as short as possible in consideration of workability when coupling the coupling members 5 to the bosses 14 and the insert nuts 13 and of a posture of the image display panel 10 when suspended by the two coupling members 5, 5.

The respective components of the present invention is not limited to the embodiment described above, and various modifications will occur to those skilled in the art without departing from the spirit and scope of the present invention as set out in the claims. For example, the number of the coupling members 5 is not limited to two, and one or three or more coupling members 5 may be provided. Furthermore, in addition to a television receiver, the present invention can be implemented on wall hanging structures of various electronic devices.

What is claimed is:

1. A wall hanging structure for mounting an electronic device that houses a main body unit inside a synthetic resin chassis on a wall surface using a wall hanging bracket, the wall hanging structure comprising:
    a main body fastening screw screwed from a rear surface of the chassis into a metallic part forming a rear surface of the main body unit to fasten the main body unit with the chassis;
    a bracket fastening screw screwed from a rear surface of the wall hanging bracket into a nut part disposed on an inner surface of the chassis to fasten the wall hanging bracket with the chassis; and
    a coupling member made of a metallic wire, which loosely extends inside the chassis between the main body fastening screw and the bracket fastening screw and which couples both fastening screws to each other.

2. The wall hanging structure according to claim 1, wherein the main body fastening screw and the bracket fastening screw are respectively disposed at four vertex positions of a square overlapping the rear surface of the main body unit, and the main body fastening screw and the bracket fastening screw disposed at at least one vertex position are coupled to each other by the coupling member.

3. The wall hanging structure according to claim 2, wherein the main body fastening screw and the bracket fastening screw respectively disposed at two vertex positions that form a diagonal relationship among the four vertex positions are coupled to each other by the coupling member.

4. The wall hanging structure according to claim 1, wherein at least one pair of the main body fastening screw and the bracket fastening screw coupled to each other by the coupling member are disposed so as to form a positional relationship where the bracket fastening screw is above and the main body fastening screw is below.

5. An electronic device which houses a main body unit inside a synthetic resin chassis and which can be mounted on a wall surface using a wall hanging bracket, the electronic device comprising:
    a main body fastening screw screwed from a rear surface of a back cabinet of the chassis into a metallic part forming a rear surface of the main body unit to fasten the main body unit with the chassis;
    a nut part which is disposed on an inner surface of the back cabinet of the chassis and into which a bracket fastening screw for mounting the wall hanging bracket to the rear surface of the back cabinet is screwed; and
    a coupling member made of a metallic wire, which loosely extends inside the chassis between the main body fastening screw and the nut part and which couples the main body fastening screw and the nut part to each other.

* * * * *